United States Patent
Shin

(10) Patent No.: US 11,500,575 B2
(45) Date of Patent: Nov. 15, 2022

(54) PATTERN GENERATION FOR MULTI-CHANNEL MEMORY ARRAY

(71) Applicant: Micron Technology, Inc., Boise, ID (US)

(72) Inventor: Sang-Hoon Shin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 17/029,718

(22) Filed: Sep. 23, 2020

(65) Prior Publication Data
US 2022/0091776 A1 Mar. 24, 2022

(51) Int. Cl.
*G06F 3/06* (2006.01)

(52) U.S. Cl.
CPC .......... *G06F 3/0655* (2013.01); *G06F 3/0604* (2013.01); *G06F 3/0673* (2013.01)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902;
(Continued)

(56) References Cited

U.S. PATENT DOCUMENTS 7,184,915 B2 * 2/2007 Hansquine ............ G11C 29/16
                                                                702/118
7,672,803 B1 * 3/2010 Lee .................. G11C 29/12005
                                                                702/117

(Continued)

OTHER PUBLICATIONS

B. Querbach et al., "A reusable BIST with software assisted repair technology for improved memory and IO debug, validation and test time," 2014 International Test Conference, 2014, pp. 1-10, doi: 10.1109/TEST.2014.7035340. (Year: 2014).*

(Continued)

*Primary Examiner* — Daniel C. Chappell
(74) *Attorney, Agent, or Firm* — Holland & Hart LLP

(57) ABSTRACT

Methods, systems, and devices for pattern generation for multi-channel memory array are described. A device may include a memory array and a circuit for testing the memory array. The memory array may include a first set of memory cells and a second set of memory cells, the first set of memory cells coupled with a first channel and the second set of memory cells coupled with a second channel. The circuit may be coupled with the memory array and may include a pattern generator and an output response analyzer. The pattern generator may be configured to selectively output a single pattern when operating in a single-pattern mode or a plurality of patterns when operating in a multi-pattern mode. The output response analyzer configured to determine whether the memory array includes one or more errors based at least in part on a pattern output by the pattern generator.

19 Claims, 8 Drawing Sheets

(58) Field of Classification Search
CPC .... G06F 2212/00–7211; G06F 2213/00–4004;
G06F 2216/00–17; G06F 2221/00–2153;
G06K 9/00–82; G06N 3/00–126; G06N
5/00–048; G06N 7/00–08; G06N 10/00;
G06N 20/00–20; G06N 99/00–007; G11B
20/00–24; G11B 33/00–1493; G11C
7/00–24; G11C 11/00–5692; G11C
13/00–06; G11C 14/00–009; G11C
15/00–06; G11C 16/00–3495; G11C
17/00–18; G11C 2207/00–229; G11C
2216/00–30; H01L 25/00–50; H01L
2225/00–1094; H04L 9/00–38; H04L
12/00–66; H04L 41/00–5096; H04L
49/00–9094; H04L 61/00–6095; H04L
67/00–42

See application file for complete search history.

(56) References Cited

U.S. PATENT DOCUMENTS

| | | | | |
|---|---|---|---|---|
| 9,110,592 | B2* | 8/2015 | Lee | G06F 3/0604 |
| 9,384,856 | B2* | 7/2016 | Spruth | G06F 11/263 |
| 9,569,120 | B2* | 2/2017 | Ryan | G06F 3/0605 |
| 10,304,556 | B2* | 5/2019 | Luck | G06F 3/0608 |
| 10,956,044 | B2* | 3/2021 | Xu | G06F 12/02 |
| 11,036,577 | B2* | 6/2021 | Shin | G06F 3/0679 |
| 11,335,427 | B1* | 5/2022 | Lin | G11C 29/38 |
| 2004/0199843 | A1* | 10/2004 | Hansquine | G11C 29/16 714/733 |
| 2015/0039957 | A1* | 2/2015 | Douskey | G06F 11/27 714/733 |
| 2016/0133312 | A1* | 5/2016 | Lee | H01L 25/0657 365/51 |
| 2017/0162276 | A1* | 6/2017 | Ok | G11C 29/36 |
| 2017/0178936 | A1* | 6/2017 | Shin | H01L 21/02057 |
| 2018/0096734 | A1* | 4/2018 | Kondo | G11C 29/4401 |
| 2019/0258487 | A1* | 8/2019 | Shin | G06F 9/355 |
| 2020/0027521 | A1* | 1/2020 | Choi | G11C 7/18 |
| 2020/0088790 | A1* | 3/2020 | Balun | G06F 13/1668 |

OTHER PUBLICATIONS

A. T. Sivaram, D. Fan and A. Yiin, "Efficient embedded memory testing with APG," Proceedings. International Test Conference, 2002, pp. 47-54, doi: 10.1109/TEST.2002.1041744. (Year: 2002).*

P. Mazumder and J. H. Patel, "An efficient built-in self testing for random-access memory," in IEEE Transactions on Industrial Electronics, vol. 36, No. 2, pp. 246-253, May 1989, doi: 10.1109/41.19076. (Year: 1989).*

* cited by examiner

PATTERN GENERATION FOR MULTI-CHANNEL MEMORY ARRAY

BACKGROUND

The following relates generally to one or more systems for memory and more specifically to pattern generation for multi-channel memory array.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
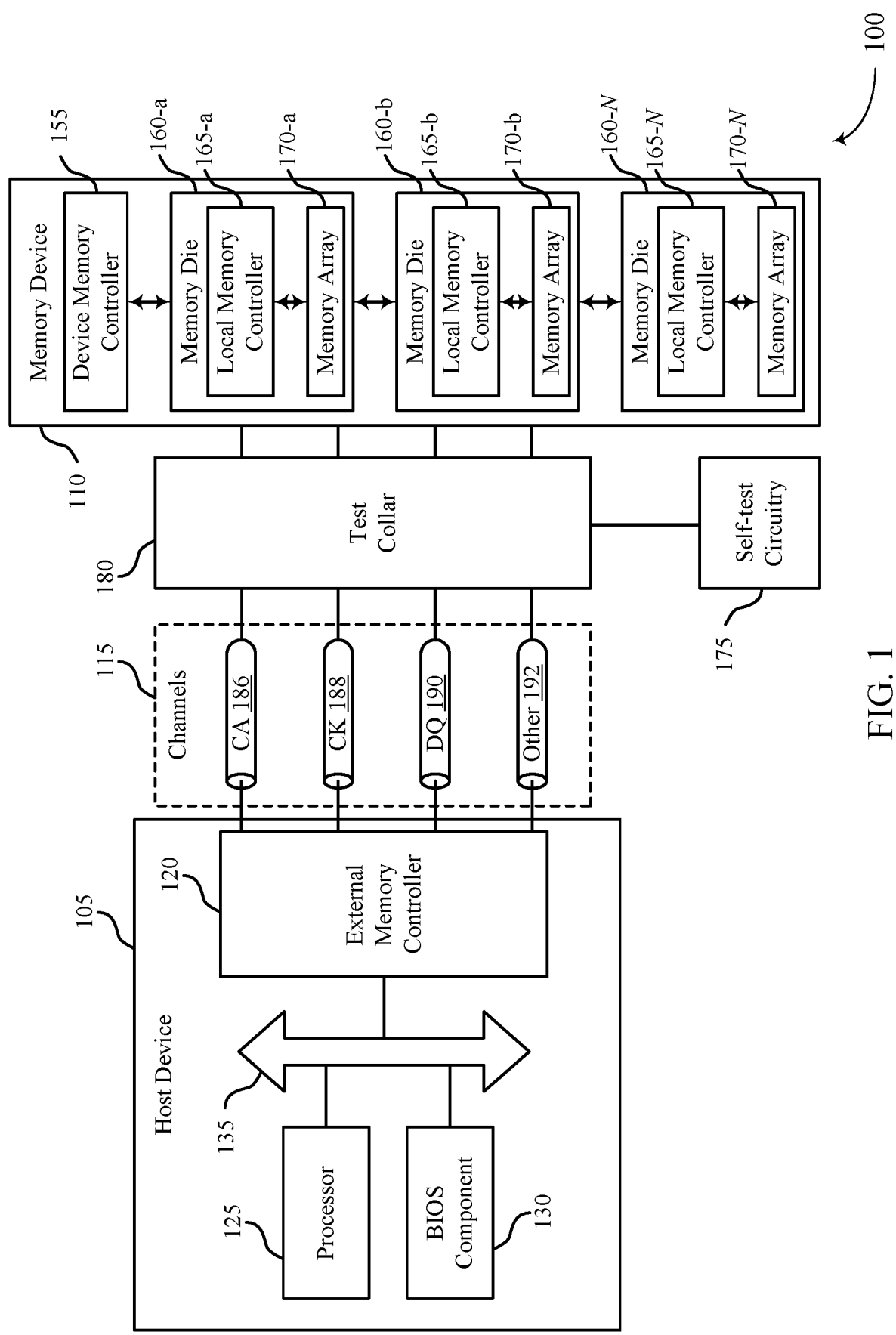
FIG. 1 illustrates an example of a system that supports pattern generation for multi-channel memory array in accordance with examples as disclosed herein.

Some memory devices include self-test circuitry, such as memory built-in self-test (MBIST) circuitry, that may enable the memory device to perform self-test procedures to identify or repair defects in a memory device. Such self-test circuitry may include, for example, a pattern generator that is configured to generate test vectors and memory addressing sequences for testing the memory array. The self-test circuitry may be configured to step through a sequence of instructions for writing test vector values to a memory array, reading the values back from the memory array, and determining whether the memory array is faulty (e.g., whether it includes one or more errors) based on whether the values read from the memory array correspond to the values written to the memory array.

Some pattern generators are configured to generate a single test pattern. In such cases, a self-test circuitry may execute a single sequence of instructions (e.g., predetermined sequence) using a single set of test vectors and memory addresses generated by the pattern generator. In some cases, however, it may be desirable to test the memory device using multiple test patterns (such as by executing multiple different sets of instructions, or by generating multiple sets of test vectors or memory addresses) to increase the likelihood that memory faults are detected. Moreover, some memory devices include a relatively large quantity of input/output channels and it may be desirable to use different test patterns on different channels to improve detection of certain defects or conditions that may highlight different defects. For example, while one channel is performing a first sequence of instructions, another channel may perform another sequence of commands or execute a refresh operation, thereby potentially allowing the self-test circuitry to detect faults that occur when the operations are performed in parallel. Thus, some self-test circuits may include two (or more) pattern generators to support generation of multiple different test patterns. In some cases, each pattern generator may include its own circuitry for generating test vectors and memory addresses. Such an approach may undesirably increase the area required to implement self-test circuitry to support multi-pattern generation.

As described herein, a memory device may include a pattern generator that may be configured to operate as either a single-pattern generator or a multi-pattern generator. That is, the pattern generator may output a single pattern when it is operating in a single-pattern mode, and may output two (or more) patterns when operating in a multi-pattern mode. For example, a pattern generator may include a single sequence of instructions that may be divided into a first pattern and a second pattern based on a split point or a reverse point associated with one of the instructions.

The self-test circuitry may include an output control that may control which pattern is provided to which channel of the memory device. For example, when the pattern generator is operating in the single-pattern mode, the output control may communicate the (single) pattern to some or all of the channels of the memory device. When the pattern generator is operating in the multi-pattern mode, the output control may communicate different patterns to different channels, such as by communicating a first pattern to a first set of channels (e.g., even-numbered channels) and a second pattern to a second set of channels (e.g., odd-numbered channels). Such an approach may provide multi-pattern generation and channel interleaving capabilities without unduly increasing the area used by the pattern generator, and may simplify the output control circuitry relative to the case of using multiple separate pattern generators for multi-pattern generation.

Features of the disclosure are initially described in the context of systems as described with reference to FIGS. 1 and 2. Features of the disclosure are described in the context systems and circuitry as described with reference to FIGS. 3-6. These and other features of the disclosure are further illustrated by and described with reference to an apparatus diagram and a flowchart that relate to pattern generation for multi-channel memory array as described with reference to FIGS. 7-8.

FIG. 1 illustrates an example of a system 100 that supports pattern generation for multi-channel memory array in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, the system 100 may include self-test circuitry 175 and a test collar 180. The self-test circuitry 175 may be configured to perform a self-test procedure on memory device 110 to detect defects, faults, or errors in memory device 110. A test collar 180 may be configured used to cause the memory device 110 to communicate with the self-test circuitry 175 during test mode and to communicate with the host device 105 during a normal mode. The test collar 180 may be coupled with the channels 115.

The self-test circuitry 175 may be configured to operate in a single-pattern mode or a multi-pattern mode. The self-test circuitry 175 may include a pattern generator that may be configured to operate as either a single-pattern generator or a multi-pattern generator. That is, the pattern generator may output a single pattern when it is operating in a single-pattern mode, and may output two (or more) patterns when operating in a multi-pattern mode. For example, a pattern generator may include a single sequence of instructions that may be divided into a first pattern and a second pattern based on a split point or a reverse point associated with one of the instructions.

The self-test circuitry 175 may include an output control that may control which pattern is provided to which channel of the memory device 110. For example, when the pattern generator is operating in the single-pattern mode, the output control may communicate the (single) pattern to some or all of the channels of the memory device 110. When the pattern generator is operating in the multi-pattern mode, the output control may communicate different patterns to different channels, such as by communicating a first pattern to a first set of channels (e.g., even-numbered channels) and a second pattern to a second set of channels (e.g., odd-numbered channels). Such an approach may provide multi-pattern generation and channel interleaving capabilities without unduly increasing the area of a die used by the pattern generator, and may simplify the output control circuitry relative to the case of using multiple separate pattern generators for multi-pattern generation.

Figure 2:
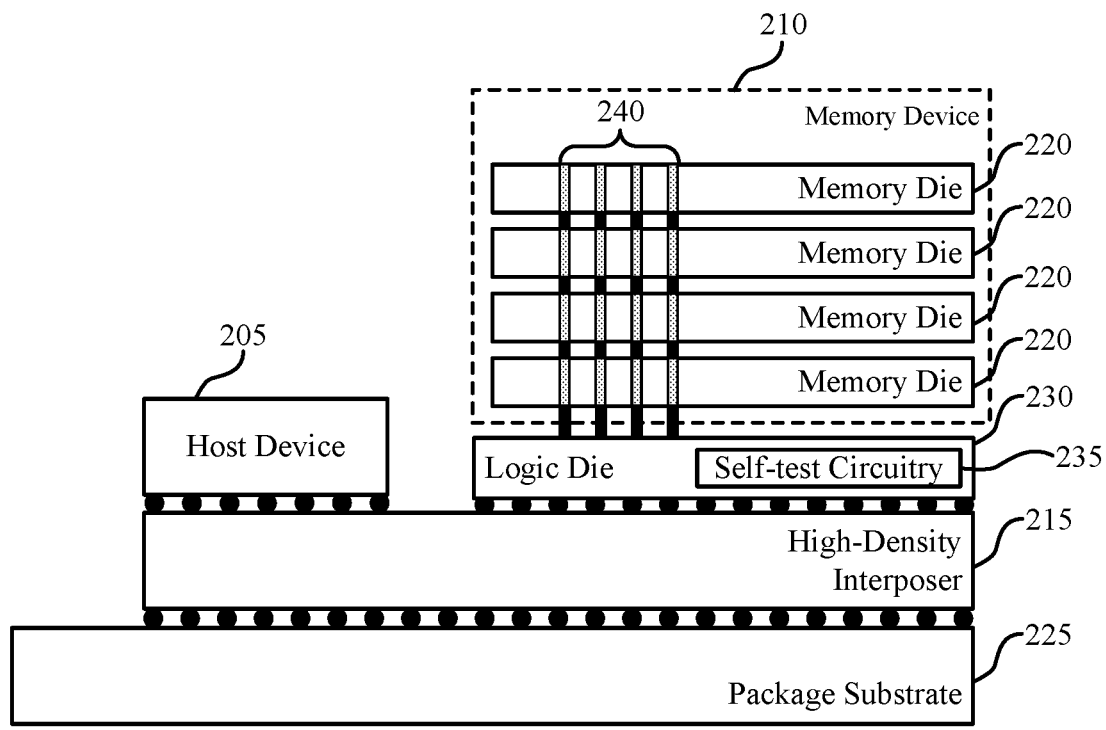
FIG. 2 illustrates an example of a memory die that supports pattern generation for multi-channel memory array in accordance with examples as disclosed herein.

FIG. 2 illustrates an example of a system 200 that supports pattern generation for multi-channel memory array in accordance with examples as disclosed herein. The system 200 may be an example of a high-bandwidth memory (HBM) technology (e.g., HBM, HBM2, HBM3, HBM3×, etc.). The system 200 may include a host device 205 coupled with a memory device 210 using a high-density interposer 215 (such as a silicon interposer or a glass interposer). The high-density interposer 215 may be positioned on a package substrate 225. In some cases, the package substrate 225 may include a power plane or ground plane, or both. The host device 205 may be an example of the host device 105 described with reference to FIG. 1. The memory device 110 may be an example of the memory devices 110 described with reference to FIG. 1. The memory device 210 may include one or more memory dies 220. The memory dies 220 may each be examples of the memory dies 160 described with reference to FIG. 1. In some cases, the memory dies 220 may be referred to as memory arrays, arrays of memory cells, or decks of memory cells.

The high-density interposer 215 may include a plurality of channels that couple the memory device 210 with the host device 205. Such channels may have a resistance and that resistance may impact an amount of power it takes to transmit data at a given data rate or frequency.

The memory device 210 may include a plurality of memory dies 220 stacked on top of one another. Each memory die 220 may be an example of the memory device 705 described with reference to FIGS. 7 and 8. In some cases, channels 240 may include a plurality of TSVs extending between the memory dies 220. Each memory die 220 may include a plurality of pins that couple the memory cells to the channels 240.

The memory device 210 may include a logic die 230 (or an interface layer) positioned between the stack of memory dies 220 and the interposer 215. The logic die 230 (e.g., HBM interface, interface, or interface layer) may be coupled with the memory dies 220 and the host device 205. The logic die 230 may include self-test circuitry 235. The self-test circuitry 235 may be configured to perform a self-test procedure on memory device 210 to detect defects, faults, or errors in memory device 210. The self-test circuitry 235 may be configured to operate in a single-pattern mode or a multi-pattern mode. The self-test circuitry 235 may include a pattern generator that may be configured to operate as either a single-pattern generator or a multi-pattern generator. That is, the pattern generator may output a single pattern when it is operating in a single-pattern mode, and may output two (or more) patterns when operating in a multi-pattern mode. The self-test circuitry 235 may include an output control that may control which pattern is provided to various channels 240 of the memory device 210. In some cases, the logic die 230 may be a die different than a die of the memory array that includes memory cells.

Figure 3:
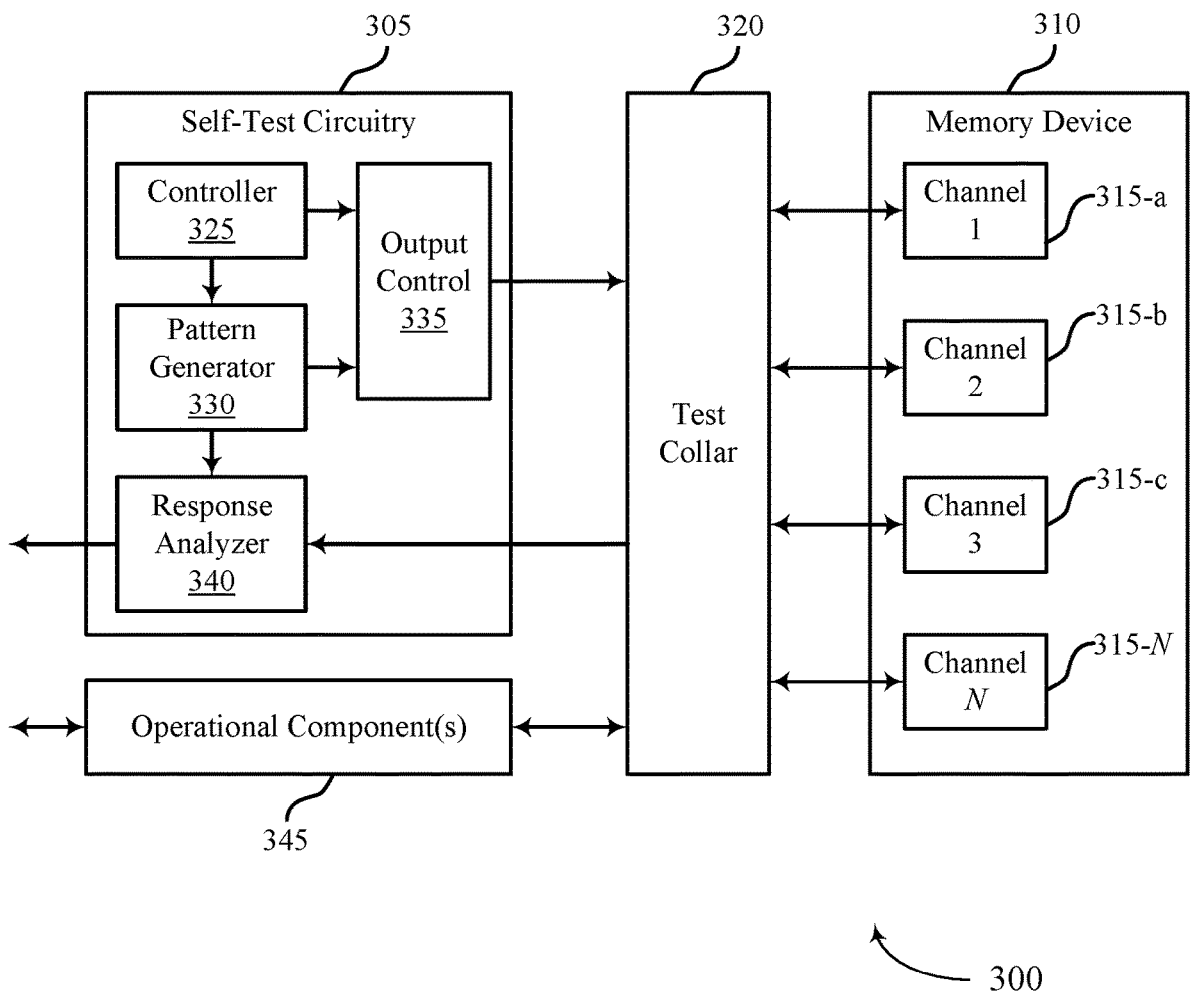
FIG. 3 illustrates an example of a system that supports pattern generation for multi-channel memory array in accordance with examples as disclosed herein.

FIG. 3 illustrates an example of a system 300 that supports pattern generation for a multi-channel memory array in accordance with examples as disclosed herein. The system 300 may be an example of the systems 100 or 200 described with reference to FIGS. 1 and 2. System 300 includes self-test circuitry 305 and a memory device 310. Memory device 310 may be an example of memory device 110 or memory device 210, and may include or may be coupled with a plurality of channels 315 (e.g., channel 315-a, 315-b, 315-c, 315-d) for communicating information with, for example, self-test circuitry 305, with a host device, or with another device. The self-test circuitry 305 may be an example of the self-test circuitry 175 and 235 described with reference to FIGS. 1 and 2. In some examples, the self-test circuitry 305 may include a sequencer coupled with the controller 325 and the pattern generator 330 and configured to receive one or more commands from the controller and generate one or more signals to initiate the pattern generator.

Self-test circuitry 305 may be configured to perform a self-test procedure on memory device 310 to detect defects, faults, or errors in memory device 310. For example, self-test circuitry 305 may be configured to perform one or more verification algorithms to check for errors in memory device 310, such as a March algorithm, checkerboard algorithm, or another algorithm, or a combination thereof. The verification algorithm may, for example, be executed by self-test circuitry 305 to write values to various memory cells in memory device 310, read the values from the memory cells, and determine whether the values read from the memory cell match the values written to the memory cell. Such verification algorithms may be used to detect various faults in one or more memory arrays of memory device 310, such as stuck-at faults (in which the state of a memory cell is "stuck" at a particular value), transition faults (in which a memory cell fails to transition from a 0 to a 1, or vice versa), and coupling faults (in which writing a value to one memory cell affects the value of a nearby memory cell).

In some examples, system 300 may include a test collar 320 that may be used to switch the memory device 310 between communicating with self-test circuitry 305 and communicating with host device as part of a standard operating mode of the memory device 310. For example, test collar 320 may couple the memory device 310 with one or more operational components 345 (e.g., host device) during normal operation, and may couple the memory device 310 with self-test circuitry 305 during a self-test procedure. In some examples, test collar 320 may be configured to receive a signal from an external controller, such as from a host device, and may couple the memory device 310 with self-test circuitry 305 or with another device based on the signal. The test collar 320 may be an example of the test collar 180 described with reference to FIG. 1.

The self-test circuitry 305 may be configured to implement one or more tests on the memory device 310. The self-test circuitry 305 may include a controller 325, a pattern generator 330, an output control 335, and a response analyzer 340.

In some examples, controller 325 may be configured to initiate a self-test procedure by providing a signal to pattern generator 330. Pattern generator 330 may, in response to receiving a signal from controller 325, generate and output one or more patterns for performing a verification algorithm on memory device 310. Such patterns may include memory access instructions, test vectors (e.g., a set of logic states to be written to memory device 310), memory address sequences, or a combination of these for performing the verification algorithm. In some examples, pattern generator 330 may include an address generator for generating the memory addresses. In some examples, pattern generator 330 may include a counter-based circuit or a linear feedback shift register for generating the test vectors.

In some cases, self-test circuitry 305 may execute a sequence of memory access instructions on memory device 310 using the test vectors and memory addresses generated by pattern generator 330. In some cases, pattern generator 330 may be configured to operate in a single-pattern mode (in which pattern generator 330 generates a single pattern) or in a multi-pattern mode (in which pattern generator 330 generates multiple patterns). Using a single pattern generator 330 to generate multiple patterns may reduce an area used by pattern generators and may improve the error detection/correction capabilities of the self-test circuitry 305.

Output control 335 may include circuitry or logic for routing the patterns output by pattern generator 330 to channels 315 of memory device 310. For example, if pattern generator 330 is operating in a multi-pattern mode and outputs two patterns, output control 335 may transmit a first pattern to a first channel (or first set of channels) of memory device 310 and may transmit a second pattern to a second channel (or second set of channels) of memory device 310. In some examples, output control 335 may support channel interleaving such that different patterns may be routed to alternating channels. In some examples, output control 335 may be configured to receive a signal from controller 325 and route patterns received from pattern generator 330 based on the signal received from controller 325. In some cases, the output control 335 and the test collar 320 may be configured to route signals to the selected channels. For instance, the test collar 320 may be configured to couple the memory device 310 with the self-test circuitry 305 or with the other operational components 345 (e.g., host device) and the output control 335 may be configured to route different patterns to different channels. In some cases, circuitry to perform the functions of the output control 335 and the test collar 320 may be implemented by the output control 335, the test collar 320, or a combination thereof.

The response analyzer 340 may be coupled with pattern generator 330 and with memory device 310. The response analyzer 340 may receive data that is output by memory device 310 (e.g., in response to a read instruction) during a self-test procedure and compare the values received from memory device 310 with expected values indicated by pattern generator 330. The response analyzer 340 may determine whether memory device 310 includes one or more errors based on the one or more patterns output by the pattern generator. in some cases, the response analyzer may determine whether the memory array includes one or more errors based on the comparisons. The response analyzer 340 may output an indication of whether memory device 310 includes one or more errors. In some cases, the response analyzer 340 may be an referred to as an output response analyzer. In some cases, the response analyzer 340 may include one or more comparators or other supporting circuitry. In some cases, the output of the response analyzer 340 may cause the memory array to be repaired based on the presence of one or more errors. For example, a faulty conductive line may be replaced using a redundant line built into the memory array. The response analyzer 340 or the host device may cause such repairs to occur based on the output of the response analyzer 340.

Additional details with respect to the operation and features of self-test circuitry 305 are described with reference to FIGS. 4 through 6.

Figure 4:
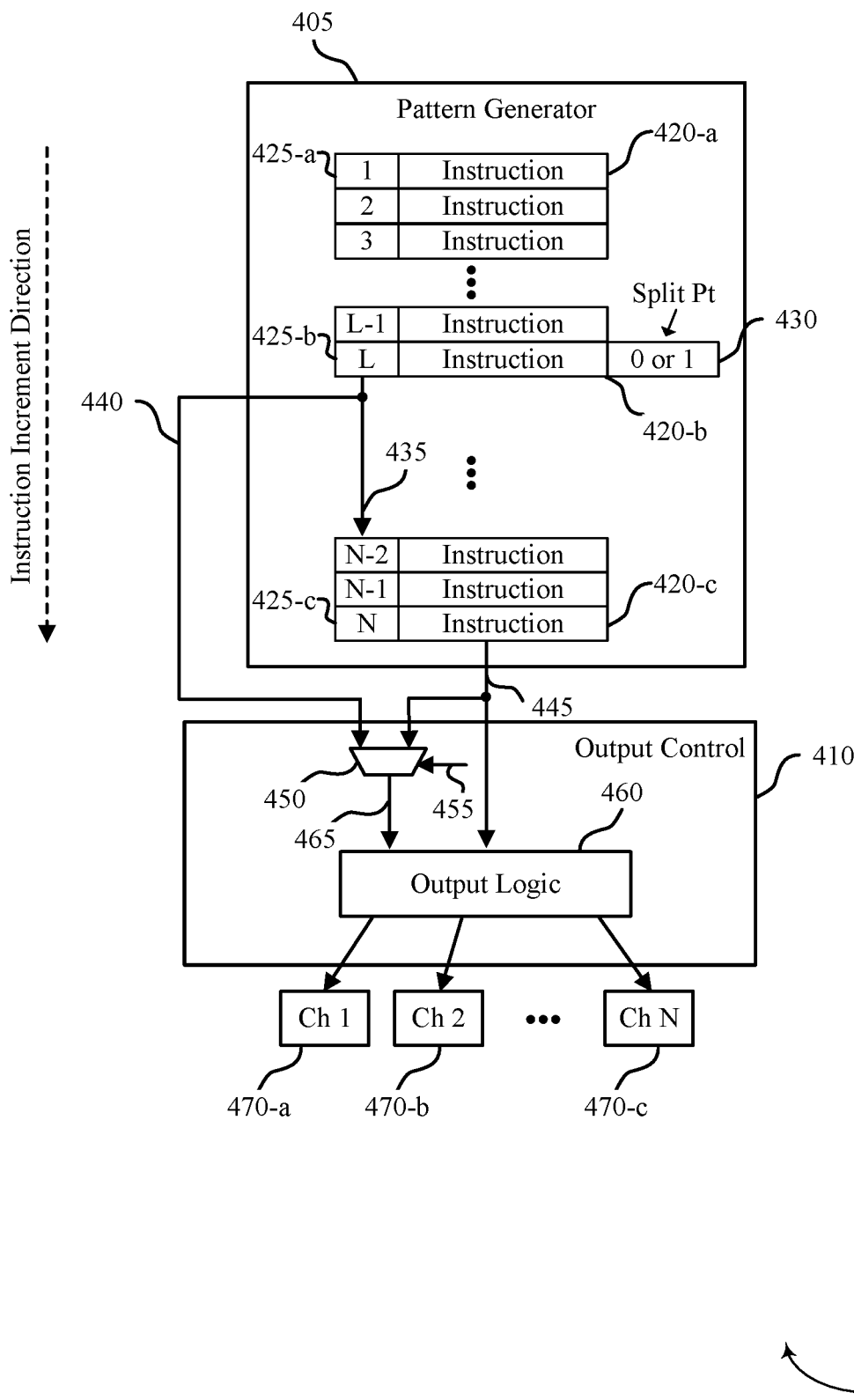
FIG. 4 illustrates an example of circuitry that supports pattern generation for multi-channel memory array in accordance with examples as disclosed herein.

FIG. 4 illustrates an example of circuitry 400 that supports pattern generation for multi-channel memory array in accordance with examples as disclosed herein. Circuitry 400 may be an example of portions of self-test circuitry 305, memory device 310, and test collar 320.

Circuitry 400 may include a pattern generator 405 coupled with an output control 410. Pattern generator 405 may be configured to output one or more patterns to output control 410 during a self-test procedure of a memory device. For example, pattern generator 405 may output a pattern that may include a sequence of instructions 420 for performing a self-test procedure of a memory device, such as for executing a March algorithm or another verification algorithm. Instructions 420 may include instruction 420-a, instruction 420-b, and instruction 420-c, for example. Such instructions 420 may include memory access instructions for writing logic states to a memory array (such as memory array 170), reading logic states from the memory array, or performing other operations related to the memory array.

In some examples, pattern generator 405 may generate one or more test vectors (e.g., a sequence of logic states, such as 0's and 1's) and memory addresses that may be used to perform the self-test procedure. Pattern generator 405 may output one or more patterns that include such test vectors, memory addresses, or both.

In some examples, pattern generator 405 may output a pattern corresponding to sequentially executing a sequence of instructions 420 in ascending order, such as based on incrementing a value of a counter. For example, instruction 420-a may be associated with counter value 425-a (1), instruction 420-b may be associated with counter value 425-b (L), and instruction 420-c may be associated with counter value 425-c (N).

In some examples, one or more instructions 420 (or corresponding counter values) may be associated with a storage element 430 (such as a register) that may contain a split point value. The split point value may be, for example, a value of 0 or 1 stored in storage element 430, and may indicate whether the sequence of instructions 420 should be divided (split), at that instruction, into two shorter sequences of instructions to generate two output patterns. Thus, in some examples, the split point value may provide an indication of whether pattern generator 405 is operating in a single-pattern mode, in which pattern generator may output a single pattern, or in a multi-pattern mode, in which pattern generator may output two or more patterns (e.g., based on one or more split points). In some cases, the storage element 430 stores a value indicating what test mode (e.g., single pattern mode or multi-pattern mode) the self-test circuitry is using to conduct tests and the split point may be identified based on the mode. In some cases, the storage element 430 may store the value indicating the test mode and may store an indicator of the location of the split point within the instruction sequence of the pattern generator 405. When splitting the pattern, a first quantity of instructions in the first portion of the data set and a second quantity of instructions in the second portion of the data set may be identified based on the split point.

In the example of circuitry 400, instruction 420-b is depicted as being associated with storage element 430. In this example, a split point value of "0" stored in storage element 430 may indicate that no split should be performed at instruction 420-b. In this case, pattern generator 405 may output, to output control 410 via path 445, a single pattern based on stepping sequentially through instructions 420-a through instructions 420-c (e.g., through logical path 435, which may represent a direction of instruction execution). For example, pattern generator 405 may increment a counter from 1 through N to step through the instructions 420, where a counter value of 1 is associated with the first instruction in the sequence of instructions and a counter value of N is associated with the last instruction in the sequence of instructions.

In some examples, if a split point value of "1" is stored in storage element 430, this may indicate that a split should be performed at instruction 420-b to divide the pattern (e.g., the sequence of instructions from 420-a through 420-c, possibly along with corresponding test vector values and memory addresses) into a first pattern that includes instructions 420-a through 420-b and a second pattern that includes the instructions after 420-b through instruction 420-c. In this case, pattern generator 405 may output the first pattern (corresponding to instructions 420-a through 420-b) to output control 410 via path 440, and may output the second pattern (e.g., corresponding to instructions after 420-b through instruction 420-c) to output control 410 via path 445. In some examples, pattern generator 405 may output the first pattern and the second pattern sequentially or in parallel. For example, if the instruction patterns are stored in a storage device, different instructions from the stored set may be output in parallel. In such examples, the instructions (or a data set) may be retrieved from the memory as part of operating in the single-pattern mode or the multi-pattern mode. Additionally, the instructions or the data set retrieved from the memory may be divided into a first portion and a second portion when operating in a multi-pattern mode to generate the different patterns used by the different channels. In other examples, if the instructions are generated sequentially by circuitry, the first pattern may be generated first and then the second pattern may be generated. In such examples, the first pattern may be stored and the first pattern and second pattern may be implemented in parallel, even if they are not generated in parallel.

Output control 410 may include a selector 450 that may include a first input coupled with path 440 and a second input coupled with path 445. The selector 450 may be coupled with a set of channels (e.g., the even-indexed channels or the odd-indexed channels) and may be configured select the pattern applied to those channels. Selector 450 may be configured to select a first pattern (e.g., from path 445) or a second pattern (e.g., from path 440) based on a control signal received at a third input of selector 450 via path 455. The control signal may be provided by a controller of the self-test circuitry, such as controller 325. Selector 450 may include an output coupled with path 465 for outputting the selected pattern via path 465. In some examples, selector 450 may output a first pattern (e.g., from path 445) when pattern generator 405 is operating in a single-pattern mode, and may output a second pattern (e.g., from path 440) when pattern generator 405 is operating in a multi-pattern mode. In some examples, selector 450 may be disabled when pattern generator is operating in a single-pattern mode, in which case the selector 450 may not output a pattern. In some examples, selector 450 may be or may include a multiplexor or other type of switching circuitry.

Output control 410 may include output logic 460, which may include logic circuitry configured to route one or more patterns (e.g., patterns output by pattern generator 405) to channels 415 of a memory device. Output logic 460 may be coupled with pattern generator 405 via path 445 and with selector 450 via path 465. Output logic 460 may receive a first pattern via path 455 and may receive the (same) first pattern, a second pattern, or no pattern via path 465, depending on whether selector 450 is configured to select the first pattern or the second pattern and on whether selector 450 is disabled. The signal on the path 455 may be based on the value of the storage element 430, in some cases.

In some examples, when pattern generator 405 is operating in a single-pattern mode, output logic 460 may output the same single pattern to some or all of channels 470. In some examples, when pattern generator 405 is operating in a multi-pattern mode, output logic 460 may output a first pattern to some of the channels 470 and a second pattern to other channels 470. For example pattern generator 405 may output a first pattern to odd-numbered channels (e.g., including channel 470-*a*) and a second pattern to even-numbered channels (e.g., including channel 470-*b*). In this manner, pattern generator 405 and output control 410 may support multi-pattern channel interleaving for self-test procedures.

In some examples, output logic 460 may include circuitry that is hardwired to route patterns received via path 465 and path 445 to particular channels 470. In some examples, output logic 460 may include circuitry that may be configurable to route patterns to channels 470 based on one or more control signals received from a controller, as discussed with reference to FIG. 6.

Although FIG. 4 depicts a pattern generator 405 with a single split point, in other examples, a pattern generator 405 may include multiple split points associated with multiple different instructions and may be capable of generating three or more patterns based on the split points. In such cases, each pattern may be output by pattern generator 405 on a different path analogous to path 440, received by output control 410, and routed to one or more channels 470.

Figure 5:
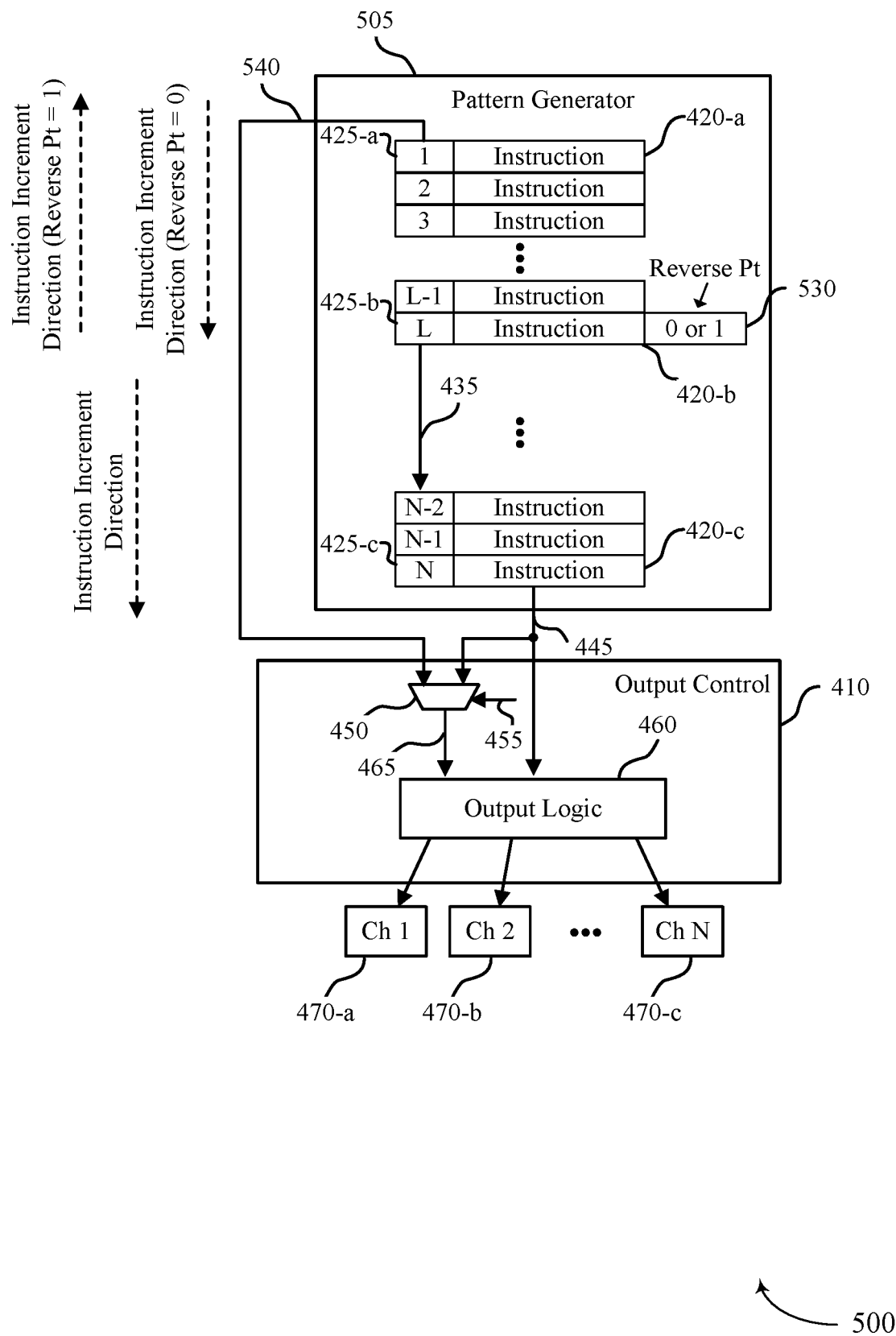
FIG. 5 illustrates an example of circuitry that supports pattern generation for multi-channel memory array in accordance with examples as disclosed herein.

FIG. 5 illustrates an example of circuitry 500 that supports pattern generation for a multi-channel memory array in accordance with examples as disclosed herein. Circuitry 500 may be an example of portions of self-test circuitry 305, memory device 310, and test collar 320. Circuitry 500 may be similar to circuitry 400 and may include some of the same elements as circuitry 400 (which may retain the same reference numbers as shown in FIG. 4), but may support inversion-based self-test procedures in which instructions may be executed in an inverted sequence (e.g., using a descending instruction counter rather than an ascending instruction counter).

Circuitry 500 may include a pattern generator 505 coupled with output control 410. Pattern generator 505 may be similar to pattern generator 405, but may use a reverse point to generate and output multiple patterns rather than using a split point.

In some examples, one or more instructions 420 (or corresponding counter values) may be associated with a storage element 530 (such as a register) that may contain a reverse point value. The reverse point value may be, for example, a value of 0 or 1 stored in storage element 530, and may indicate whether the sequence of instructions 420 should be divided (split), at that instruction, into two shorter sequences of instructions to generate two output patterns. Thus, in some examples, the reverse point value may provide an indication of whether pattern generator 505 is operating in a single-pattern mode, in which pattern generator may output a single pattern, or in a multi-pattern mode, in which pattern generator may output two patterns (e.g., based on a reverse point).

In some examples, when the reverse point value is set to "0," pattern generator 505 may behave in a manner similar to pattern generator 405 and may output a single pattern corresponding to instructions 1 through N via path 445. That is, pattern generator may step through instructions 1 through N sequentially, such as using an ascending counter.

In contrast, when the reverse point value is set to "1," pattern generator 505 may generate and output two patterns: a first pattern that corresponds to sequentially executing instructions L through 1 in descending order (e.g., by decrementing a counter, which may be an example of a second direction to increment instructions), and a second pattern that corresponds to executing instructions L+1 through N in ascending order (e.g., by incrementing a counter, which may be an example of a first direction to increment instructions). Pattern generator 505 may output the first pattern to output control 410 via path 540, and may output the second pattern via path 445.

In some cases, the storage element 430 stores a value indicating what test mode (e.g., single pattern mode or multi-pattern mode) the self-test circuitry is using to conduct tests and the split point may be identified based on the mode. In some cases, the storage element 430 may also store an indicator of whether the multi-pattern mode uses a split point (described with reference to FIG. 4) or a reverse point (described with reference to FIG. 5). In some cases, the storage element 430 may also store an indicator of the location of the split or reverse point within the instruction sequence of the pattern generator 405.

Although FIG. 5 depicts a pattern generator 505 with a single reverse point, in other examples, a pattern generator 505 may include multiple reverse points associated with different locations within the instructions, multiple split points associated with different locations within the instructions of one or more reverse points and one or more split points, or combinations thereof. In such cases, each pattern may be output by pattern generator 505 on a different path analogous to path 540, received by output control 410, and routed to one or more channels 470.

Other operations of circuitry 500 may be similar to those described with reference to circuitry 400. In some examples, a pattern generator may support both split points and reverse points to implement multi-pattern generation.

Figure 6:
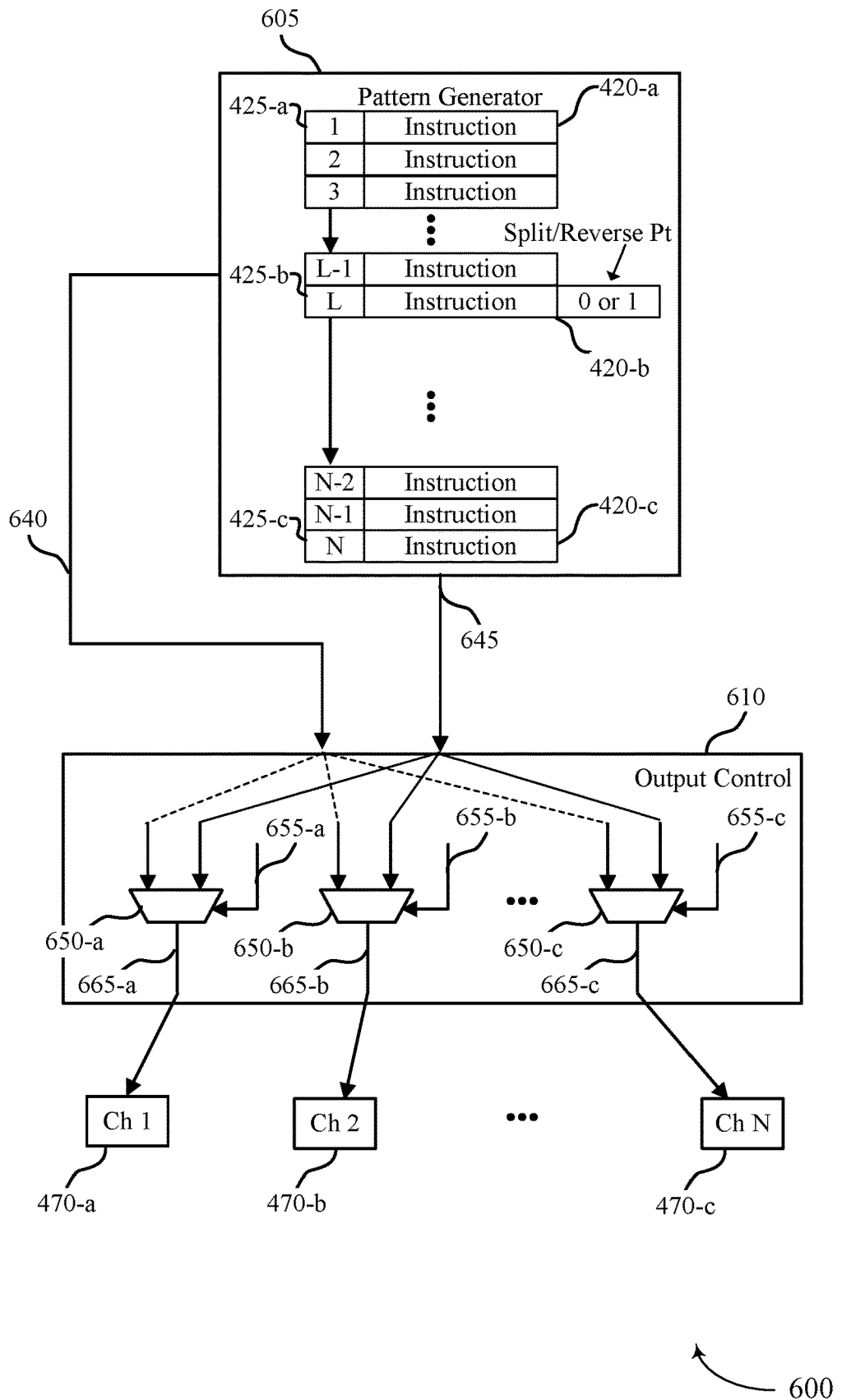
FIG. 6 illustrates an example of circuitry that supports pattern generation for multi-channel memory array in accordance with examples as disclosed herein.

FIG. 6 illustrates an example of circuitry 600 that supports pattern generation for a multi-channel memory array in accordance with examples as disclosed herein. Circuitry 600 may be an example circuitry 400 or 500 described with reference to FIGS. 4 and 5.

Circuitry 600 may include a pattern generator 605 coupled with output control 610. Pattern generator 605 may be an example of pattern generator 405, 505 described with reference to FIGS. 4 and 5. Output control 610 may be an example of output control 410 or may be a replacement for output control 410. Pattern generator 605 may output a first pattern to output control 610 via path 645, and may output a second pattern to output control 610 via path 640. The patterns output by the pattern generator 605 may be similar to the patterns and features described with reference to FIGS. 4 and 5.

Output control 610 may include multiple selectors 650, which may be examples of selector 450. Similarly to the operation of selector 450, each selector 650 may be configured to receive one or both of the first pattern and second pattern and to select, based on a control signal 655, whether to output the first pattern or the second pattern to a channel 470 via control signal 655. In some examples, each channel 470 may be coupled with a corresponding selector 650 such that output control 610 may be capable of routing either of the two patterns to any of the channels 470 using the corresponding selector 650. That is, output control 610 may provide additional flexibility for channel interleaving relative to an output control with a predetermined routing of patterns to channels, such as an output control that is configured to always route one pattern to odd-numbered channels and another pattern to even-numbered channels. In the output control 610, each channel may be selectable between the different patterns output by the pattern generator 605. The output control 610 may provide additional granularity of control as compared with the output controls 410 and 510 described with reference to FIGS. 4 and 5.

Figure 7:
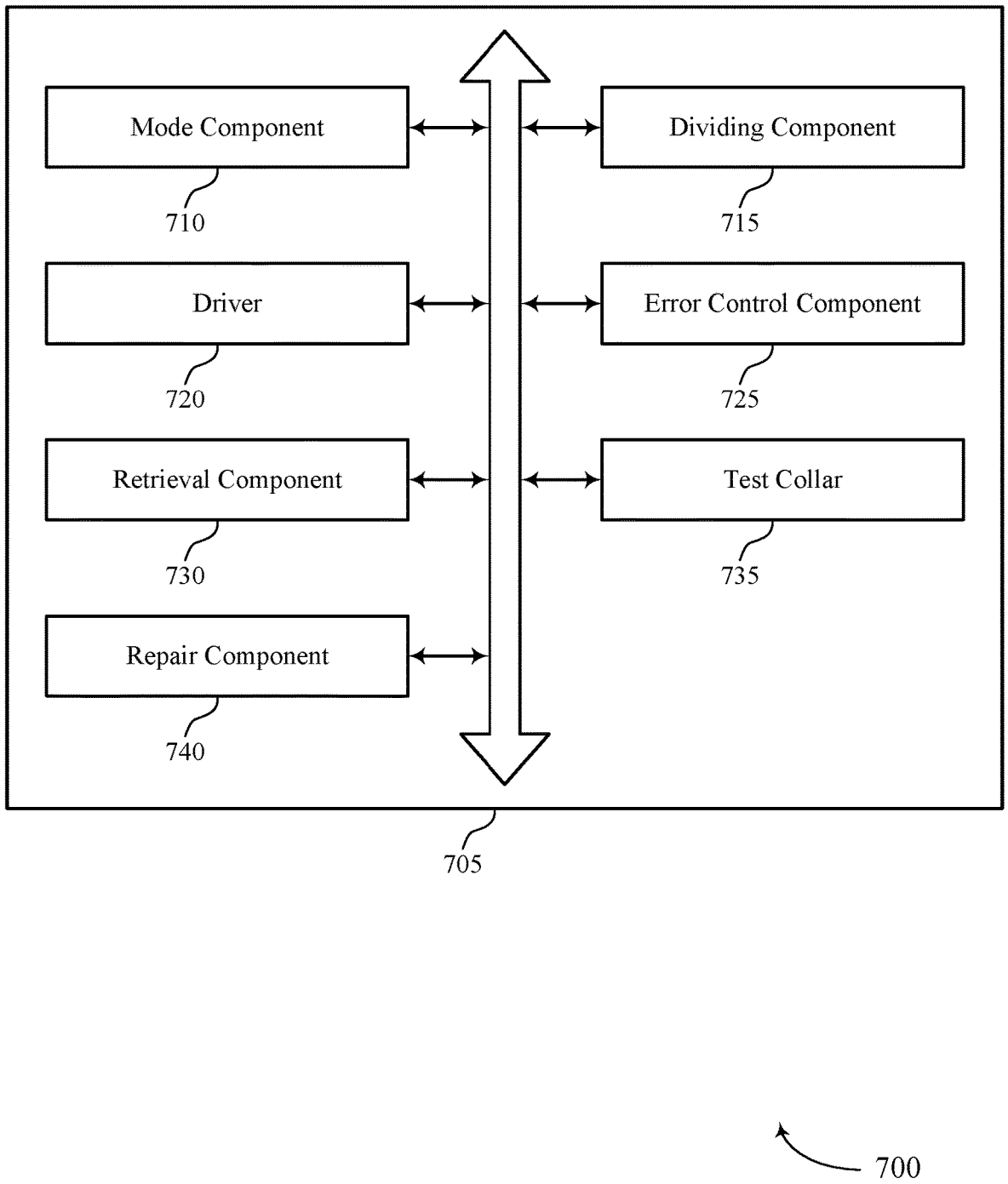
FIG. 7 shows a block diagram of a memory device that supports pattern generation for multi-channel memory array in accordance with examples as disclosed herein.

FIG. 7 shows a block diagram 700 of a memory device 705 that supports pattern generation for multi-channel memory array in accordance with examples as disclosed herein. The memory device 705 may be an example of aspects of a memory device as described with reference to FIGS. 1-6. The memory device 705 may include a mode component 710, a dividing component 715, a driver 720, an error control component 725, a retrieval component 730, a test collar 735, and a repair component 740. Each of these modules may communicate, directly or indirectly, with one another (e.g., via one or more buses).

The mode component 710 may identify whether a pattern generator of a circuit coupled with a memory array is operating in a single-pattern mode or a multi-pattern mode. In some examples, the mode component 710 may identify an indicator associated with the data set, where identifying whether the pattern generator is operating in the single-pattern mode or the multi-pattern mode is based on identifying the indicator. In some examples, the mode component 710 may generate a signal configured to cause a selector to transmit the first portion of the data set to the second channel or the second portion of the data set to the second channel based on identifying whether the pattern generator is operating in the single-pattern mode or the multi-pattern mode, where transmitting the first portion and the second portion is based on generating the signal. In some examples, the mode component 710 may identify that the pattern generator is operating in the single-pattern mode.

The dividing component 715 may divide a data set for testing the memory array into a first portion and a second portion based on identifying that the pattern generator is operating in the multi-pattern mode. In some examples, the dividing component 715 may identify a first quantity of instructions in the first portion of the data set and a second quantity of instructions in the second portion of the data set based on the indicator, where dividing the data set is based on identifying the first quantity of instructions and the second quantity of instructions. In some examples, the dividing component 715 may identify a first direction to increment instructions of the first portion of the data set and a second direction to increment instructions of the second portion of the data set based on the indicator, where transmitting the first portion and the second portion is based on identifying the first direction and the second direction.

The driver 720 may transmit the first portion of the data set to a first channel of the memory array and the second portion of the data set to a second channel of the memory array based on dividing the data set. In some examples, the driver 720 may transmit a second data set to the first channel and the second channel of the memory array based on identifying that the pattern generator is operating in the single-pattern mode.

The error control component 725 may determine whether the memory array includes one or more errors based on transmitting the first portion to the first channel and the second portion to the second channel. In some examples, the error control component 725 may determine whether the memory array includes one or more errors based on transmitting the second data set to the first channel and the second channel.

The retrieval component 730 may retrieve the data set from a memory, where identifying whether the pattern generator is operating in the single-pattern mode or the multi-pattern mode is based on retrieving the data set from the memory.

The test collar 735 may couple the circuit with the memory array, where identifying whether the pattern generator is operating in the single-pattern mode or the multi-pattern mode is based on coupling the circuit with the memory array.

The repair component 740 may repair the memory array based on determining that the memory array includes the one or more errors.

Figure 8:
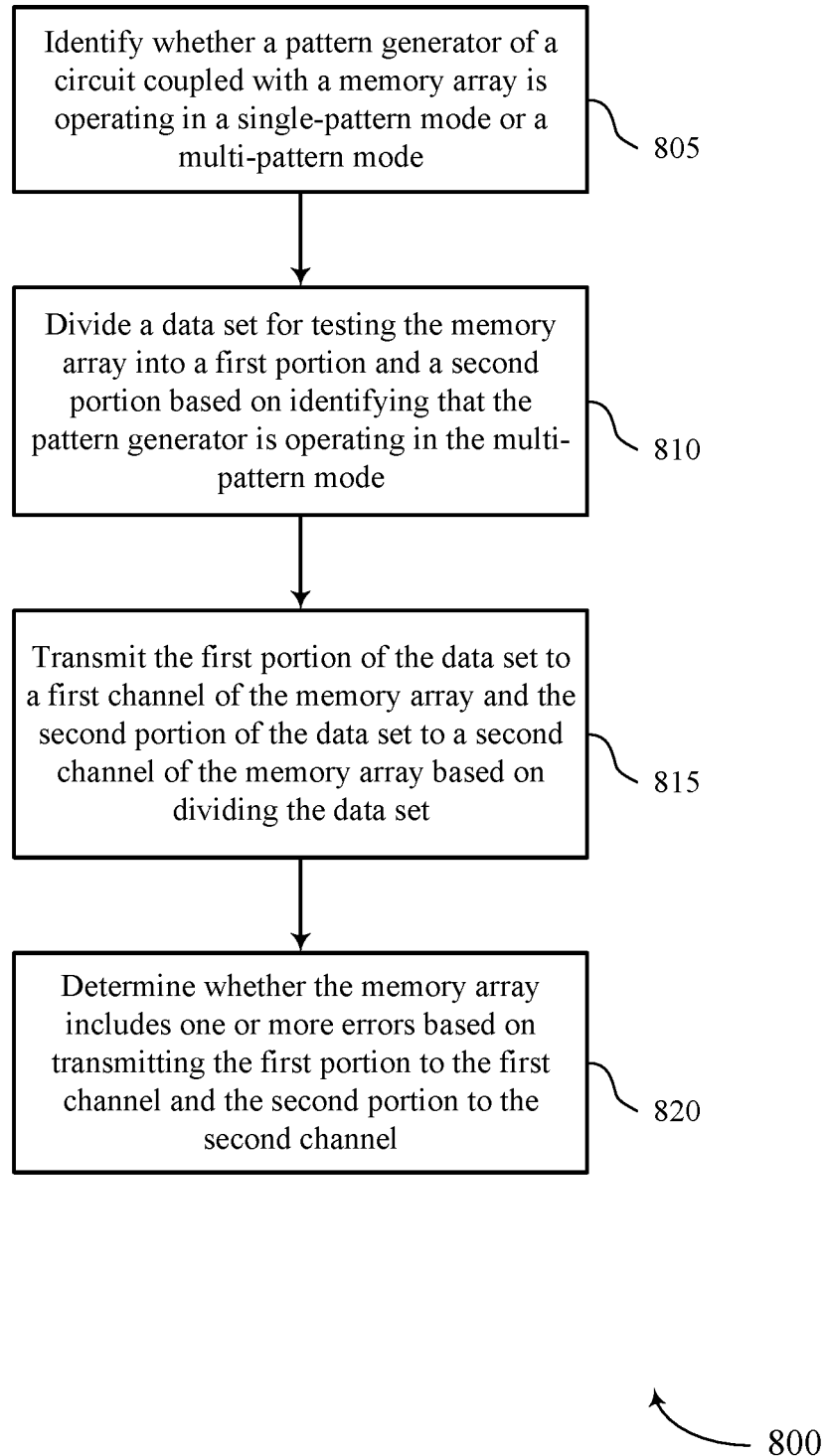
FIG. 8 shows a flowchart illustrating a method or methods that support pattern generation for multi-channel memory array in accordance with examples as disclosed herein.

FIG. 8 shows a flowchart illustrating a method or methods 800 that supports pattern generation for multi-channel memory array in accordance with examples as disclosed herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may identify whether a pattern generator of a circuit coupled with a memory array is operating in a single-pattern mode or a multi-pattern mode. The operations of 805 may be performed according to the methods described herein. In some examples, aspects of the operations of 805 may be performed by a mode component as described with reference to FIG. 7.

At 810, the memory device may divide a data set for testing the memory array into a first portion and a second portion based on identifying that the pattern generator is operating in the multi-pattern mode. The operations of 810 may be performed according to the methods described herein. In some examples, aspects of the operations of 810 may be performed by a dividing component as described with reference to FIG. 7.

At 815, the memory device may transmit the first portion of the data set to a first channel of the memory array and the second portion of the data set to a second channel of the memory array based on dividing the data set. The operations of 815 may be performed according to the methods described herein. In some examples, aspects of the operations of 815 may be performed by a driver as described with reference to FIG. 7.

At 820, the memory device may determine whether the memory array includes one or more errors based on transmitting the first portion to the first channel and the second portion to the second channel. The operations of 820 may be performed according to the methods described herein. In some examples, aspects of the operations of 820 may be performed by an error control component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for identifying whether a pattern generator of a circuit coupled with a memory array is operating in a single-pattern mode or a multi-pattern mode, dividing a data set for testing the memory array into a first portion and a second portion based on identifying that the pattern generator is operating in the multi-pattern mode, transmitting the first portion of the data set to a first channel of the memory array and the second portion of the data set to a second channel of the memory array based on dividing the data set, and determining whether the memory array includes one or more errors based on transmitting the first portion to the first channel and the second portion to the second channel.

Some examples of the method 800 and the apparatus described herein may further include operations, features, means, or instructions for identifying an indicator associated with the data set, where identifying whether the pattern generator may be operating in the single-pattern mode or the multi-pattern mode may be based on identifying the indicator.

Some examples of the method 800 and the apparatus described herein may further include operations, features, means, or instructions for identifying a first quantity of instructions in the first portion of the data set and a second quantity of instructions in the second portion of the data set based on the indicator, where dividing the data set may be based on identifying the first quantity of instructions and the second quantity of instructions.

Some examples of the method 800 and the apparatus described herein may further include operations, features, means, or instructions for identifying a first direction to increment instructions of the first portion of the data set and a second direction to increment instructions of the second portion of the data set based on the indicator, where transmitting the first portion and the second portion may be based on identifying the first direction and the second direction.

Some examples of the method 800 and the apparatus described herein may further include operations, features, means, or instructions for generating a signal configured to cause a selector to transmit the first portion of the data set to the second channel or the second portion of the data set to the second channel based on identifying whether the pattern generator may be operating in the single-pattern mode or the multi-pattern mode, where transmitting the first portion and the second portion may be based on generating the signal.

Some examples of the method 800 and the apparatus described herein may further include operations, features, means, or instructions for retrieving the data set from a memory, where identifying whether the pattern generator may be operating in the single-pattern mode or the multi-pattern mode may be based on retrieving the data set from the memory.

Some examples of the method 800 and the apparatus described herein may further include operations, features, means, or instructions for identifying that the pattern generator may be operating in the single-pattern mode, transmitting a second data set to the first channel and the second channel of the memory array based on identifying that the pattern generator may be operating in the single-pattern mode, and determining whether the memory array includes one or more errors based on transmitting the second data set to the first channel and the second channel.

Some examples of the method 800 and the apparatus described herein may further include operations, features, means, or instructions for coupling, using a test collar, the circuit with the memory array, where identifying whether the pattern generator may be operating in the single-pattern mode or the multi-pattern mode may be based on coupling the circuit with the memory array.

Some examples of the method 800 and the apparatus described herein may further include operations, features, means, or instructions for repairing the memory array based on determining that the memory array includes the one or more errors.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array including a first set of memory cells and a second set of memory cells, the first set of memory cells coupled with a first channel and the second set of memory cells coupled with a second channel and a circuit coupled with the memory array and including a pattern generator configured to selectively output a single pattern when operating in a single-pattern mode or a set of patterns when operating in a multi-pattern mode and an output response analyzer configured to determine whether the memory array includes one or more errors based on a pattern output by the pattern generator.

In some examples, the circuit further may include operations, features, means, or instructions for an output control configured to communicate a first pattern of the set of patterns to the first channel and a second pattern of the set of patterns to the second channel when the pattern generator operates in the multi-pattern mode and communicate the single pattern to the first channel and the second channel when the pattern generator operates in the single pattern mode.

In some examples, the output control may include operations, features, means, or instructions for a selector coupled with the second channel of the memory array and configured to selectively output the first pattern to the second channel from the pattern generator or a second pattern to the second channel from the pattern generator based on whether the pattern generator may be operating in the single-pattern mode or the multi-pattern mode.

In some examples, the circuit further may include a controller configured to cause the circuit to perform a test procedure. In some examples, the controller may be further configured to cause the pattern generator to operate in the single-pattern mode or the multi-pattern mode.

In some examples, the circuit further may include a sequencer configured to receive one or more commands from the controller and generate one or more signals to initiate the pattern generator.

Some examples of the apparatus may include a test collar configured to selectively couple the memory array with the circuit or with a host device.

Some examples of the apparatus may include a high-bandwidth memory interface coupled with the memory array and a host device.

In some examples, the circuit may be on a first die different than a second die of the memory array that includes memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array comprising a first set of memory cells and a second set of memory cells, the first set of memory cells coupled with a first channel and the second set of memory cells coupled with a second channel; and
   a circuit coupled with the memory array and comprising:
   a pattern generator configured to selectively output a single pattern in response to operating in a single-pattern mode of a test procedure and a plurality of patterns in response to operating in a multi-pattern mode of the test procedure;
   an output control configured to communicate, in parallel, a first pattern of the plurality of patterns to the first channel and a second pattern of the plurality of patterns to the second channel in response to the pattern generator operating in the multi-pattern mode of the test procedure and communicate the single pattern to the first channel and the second channel when the pattern generator operates in the single-pattern mode of the test procedure; and
   an output response analyzer configured to determine whether the memory array includes one or more errors based at least in part on a pattern output by the pattern generator.

2. The apparatus of claim 1, wherein the output control comprises a selector coupled with the second channel of the memory array and configured to selectively output the first pattern to the second channel from the pattern generator or the second pattern to the second channel from the pattern generator based at least in part on whether the pattern generator is operating in the single-pattern mode or the multi-pattern mode.

3. The apparatus of claim 1, wherein the circuit further comprises a controller configured to cause the circuit to perform the test procedure.

4. The apparatus of claim 3, wherein the controller is further configured to cause the pattern generator to operate in the single-pattern mode or the multi-pattern mode.

5. The apparatus of claim 3, wherein the circuit further comprises:

a sequencer configured to receive one or more commands from the controller and generate one or more signals to initiate the pattern generator.

6. The apparatus of claim 1, further comprising:
a test collar configured to selectively couple the memory array with the circuit or with a host device.

7. The apparatus of claim 1, further comprising:
a high-bandwidth memory interface coupled with the memory array and a host device.

8. The apparatus of claim 1, wherein the circuit is on a first die different than a second die of the memory array that comprises memory cells.

9. A method, comprising:
identifying whether a pattern generator of a circuit coupled with a memory array is operating in a single-pattern mode or a multi-pattern mode;
dividing a data set for testing the memory array into a first portion and a second portion based at least in part on identifying that the pattern generator is operating in the multi-pattern mode;
transmitting, in parallel, the first portion of the data set to a first channel of the memory array and the second portion of the data set to a second channel of the memory array based at least in part on dividing the data set; and
determining whether the memory array includes one or more errors based at least in part on transmitting the first portion of the data set to the first channel and the second portion of the data set to the second channel.

10. The method of claim 9, further comprising:
identifying an indicator associated with the data set, wherein identifying whether the pattern generator is operating in the single-pattern mode or the multi-pattern mode is based at least in part on identifying the indicator.

11. The method of claim 10, further comprising:
identifying a first quantity of instructions in the first portion of the data set and a second quantity of instructions in the second portion of the data set based at least in part on the indicator, wherein dividing the data set is based at least in part on identifying the first quantity of instructions and the second quantity of instructions.

12. The method of claim 10, further comprising:
identifying a first direction to increment instructions of the first portion of the data set and a second direction to increment instructions of the second portion of the data set based at least in part on the indicator, wherein transmitting the first portion of the data set and the second portion of the data set is based at least in part on identifying the first direction and the second direction.

13. The method of claim 9, further comprising:
generating a signal configured to cause a selector to transmit the first portion of the data set to the second channel or the second portion of the data set to the second channel based at least in part on identifying whether the pattern generator is operating in the single-pattern mode or the multi-pattern mode, wherein transmitting the first portion of the data set and the second portion of the data set is based at least in part on generating the signal.

14. The method of claim 9, further comprising:
retrieving the data set from a memory, wherein identifying whether the pattern generator is operating in the single-pattern mode or the multi-pattern mode is based at least in part on retrieving the data set from the memory.

15. The method of claim 9, further comprising:
identifying that the pattern generator is operating in the single-pattern mode;
transmitting a second data set to the first channel and the second channel of the memory array based at least in part on identifying that the pattern generator is operating in the single-pattern mode; and
determining whether the memory array includes one or more errors based at least in part on transmitting the second data set to the first channel and the second channel.

16. The method of claim 9, further comprising:
coupling, using a test collar, the circuit with the memory array, wherein identifying whether the pattern generator is operating in the single-pattern mode or the multi-pattern mode is based at least in part on coupling the circuit with the memory array.

17. The method of claim 9, further comprising:
repairing the memory array based at least in part on determining that the memory array includes the one or more errors.

18. A non-transitory computer-readable medium storing code comprising instructions which, when executed by a processor of an electronic device, cause the electronic device to:
identify whether a pattern generator of a circuit coupled with a memory array is operating in a single-pattern mode or a multi-pattern mode;
divide a data set for testing the memory array into a first portion and a second portion based at least in part on identifying that the pattern generator is operating in the multi-pattern mode;
transmit, in parallel, the first portion of the data set to a first channel of the memory array and the second portion of the data set to a second channel of the memory array based at least in part on dividing the data set; and
determine whether the memory array includes one or more errors based at least in part on transmitting the first portion of the data set to the first channel and the second portion of the data set to the second channel.

19. The non-transitory computer-readable medium of claim 18, wherein the instructions, when executed by the processor of the electronic device, further cause the electronic device to:
identify an indicator associated with the data set, wherein identifying whether the pattern generator is operating in the single-pattern mode or the multi-pattern mode is based at least in part on identifying the indicator.

* * * * *